United States Patent [19]
Hattori

[11] Patent Number: 5,977,900
[45] Date of Patent: Nov. 2, 1999

[54] D/A CONVERTER

[75] Inventor: Takahiro Hattori, Tokyo, Japan

[73] Assignee: NEC Corporation, Japan

[21] Appl. No.: 08/908,993

[22] Filed: Aug. 8, 1997

[30] Foreign Application Priority Data

Aug. 9, 1996 [JP] Japan .................................. 8-227782

[51] Int. Cl.⁶ .................................................. H03M 1/78
[52] U.S. Cl. ........................................................ 341/154
[58] Field of Search ..................................... 341/144, 154, 341/145, 155, 142

[56] References Cited

U.S. PATENT DOCUMENTS 4,651,729  3/1987  Rae ..................................... 128/203.14

FOREIGN PATENT DOCUMENTS 63-73718   4/1988  Japan .
5-324139  12/1993  Japan .

OTHER PUBLICATIONS

Japanese Patent Office Action Dated Oct. 6, 1998 Along With a Translation of Same.

Primary Examiner—Brian Young
Attorney, Agent, or Firm—Ostrolenk, Faber, Gerb & Soffen, LLP

[57] ABSTRACT

A buffer amplifier is inserted out the input of a D/A converter circuit having an R/2R ladder circuit configuration to provide a D/A converter which, when the D/A output is in an unused state, has reduced current consumption and, at the same time, can stabilize the reference voltage. When the buffer amplifier is placed in a stand-by state, it sets the output of the D/A converter at a high impedance value.

7 Claims, 7 Drawing Sheets

D/A CONVERTER

FILED OF THE INVENTION

The present invention relates to a D/A converter and more particularly to a D/A converter which, when it is in an unused state, has reduced power consumption and, at the same time, can stabilize the reference voltage.

BACKGROUND OF THE INVENTION

Among conventional D/A converters that use the R-2R system is a D/A converter disclosed, for example, in Japanese Patent Laid-Open No. 324139/1993. This D/A converter comprises a plurality of functional sections accommodated in MCU and performs various functions and operations. It has a register section for stopping the supply of a power into each of the plurality of functional sections including the CPU, and a switch is used to stop the supply of current into an internal circuit.

According to the conventional D/A converter, addition of a switch serves to suppress the current consumption during the unused condition of the D/A converter. However, a variation in impedance of the reference voltage disadvantageously results in a variation in the current value fed. To address this problem generally requires the use of an exterior type current feed buffer for use during operation of the D/A converter.

SUMMARY OF THE INVENTION

Accordingly, an object of the present invention is to provide a D/A converter which has reduced current consumption during the unused condition of the D/A output and, at the same time, can stabilize the reference voltage.

According to a first feature of the invention, a D/A converter of the R-2R system, comprises: n resistors having a value (R); (n+2) resistors having double value (2R); (n+1) switches (SW); a positive reference voltage terminal (VrefU); a negative reference voltage terminal (VrefL); and (n+1) binary input signal terminals (BD), said D/A converter further comprising a buffer amplifier of which can be on-off controlled by a stand-by signal.

According to a second feature of the invention, a D/A converter, comprises: split resistors (a voltage divider) provided between first and second reference voltage terminals; and an R-2R ladder circuit provided at a connecting point of the split resistors, wherein a buffer amplifier of which the on and off states are switched by a control signal is provided between— of the first reference voltage terminal and one end of the split resistors.

BRIEF DESCRIPTION OF THE DRAWINGS

The invention will be explained in more detail in conjunction with the appended drawings, wherein.

DESCRIPTION OF A PREFERRED EMBODIMENT

Before explaining a D/A converter of a preferred embodiment according to the invention, the background of the invention will be explained in more detail in conjunction with FIGS. 1 to 5.

Figure 1:
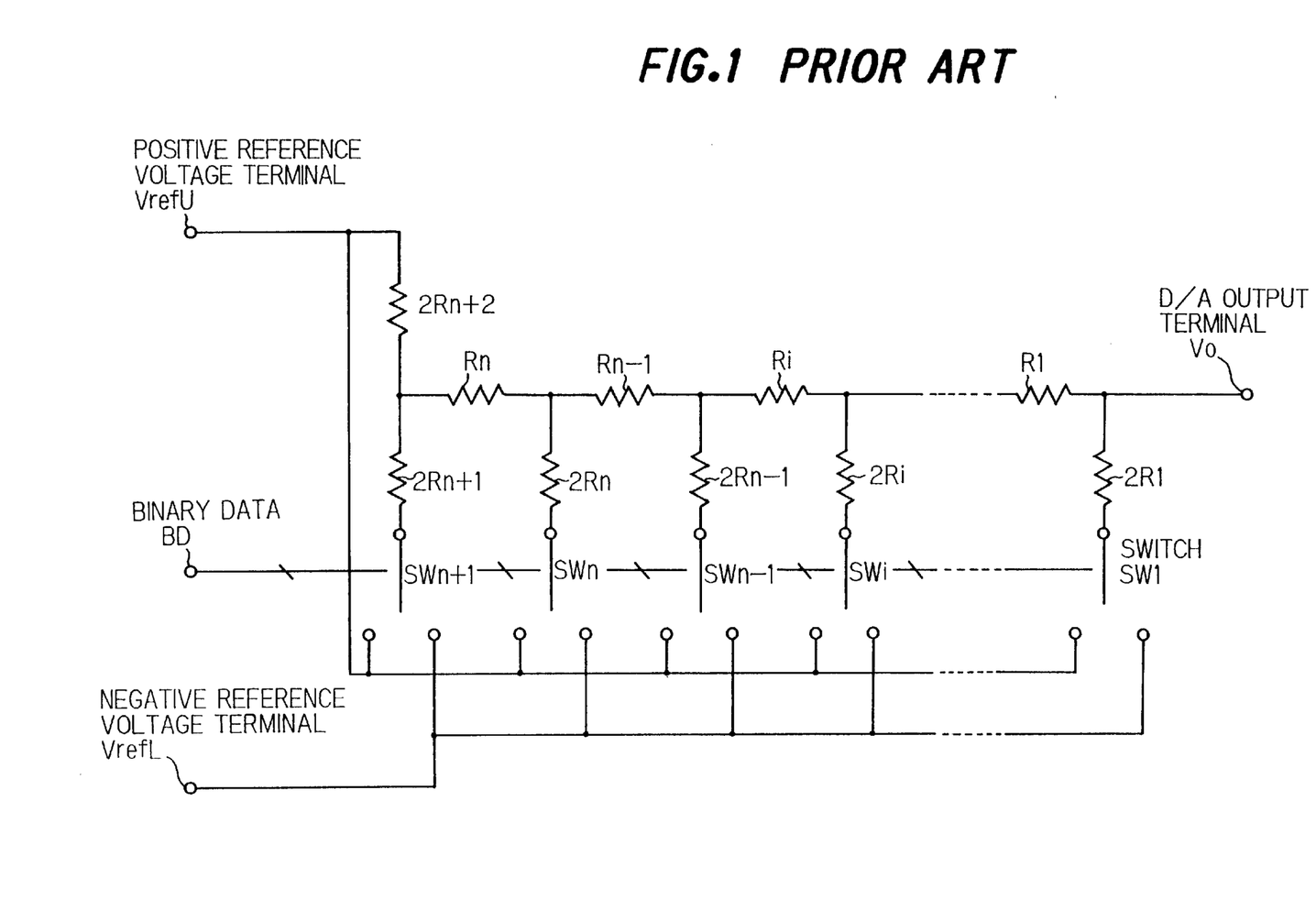
FIG. 1 is a typical circuit diagram of a conventional D/A converter.

FIG. 1 shows a typical circuit configuration of the conventional D/A converter employing an R-2R resistor network system.

In FIG. 1, the circuit comprises: an R-2R ladder circuit constituted by n resistors R1–Rn for determining an analog voltage and (n+2) resistors 2R1–2Rn+2 of which the resistance value is twice that of the resistor R; (n+1) switches SW1–SWn capable of selecting between two voltage values to be connected to a corresponding 2R resistor; and n binary signal terminals BD.

In FIG. 1, switching of the switch SWi is determined by binary data BDi from the binary input signal terminal. It results in a variation in combined resistance of the R-2R ladder circuit. A voltage between a positive reference voltage VrefU determined by the combined resistance value of the R-2R ladder circuit and a negative reference voltage VrefL is output into the output voltage terminal. The resolution of the output voltage is determined by the number of switches SWi (=the number of binary input signals), and when the number of switches SWi is n, the resolution of the output voltage is the nth power of 2 (=$2^n$).

In the above D/A converter using the R-2R system, even when the D/A output voltage terminal $V_O$ is in unused state, a current flows into the resistors of the R-2R ladder circuit depending upon the state of the switch SW, resulting in current consumption.

Figure 2:
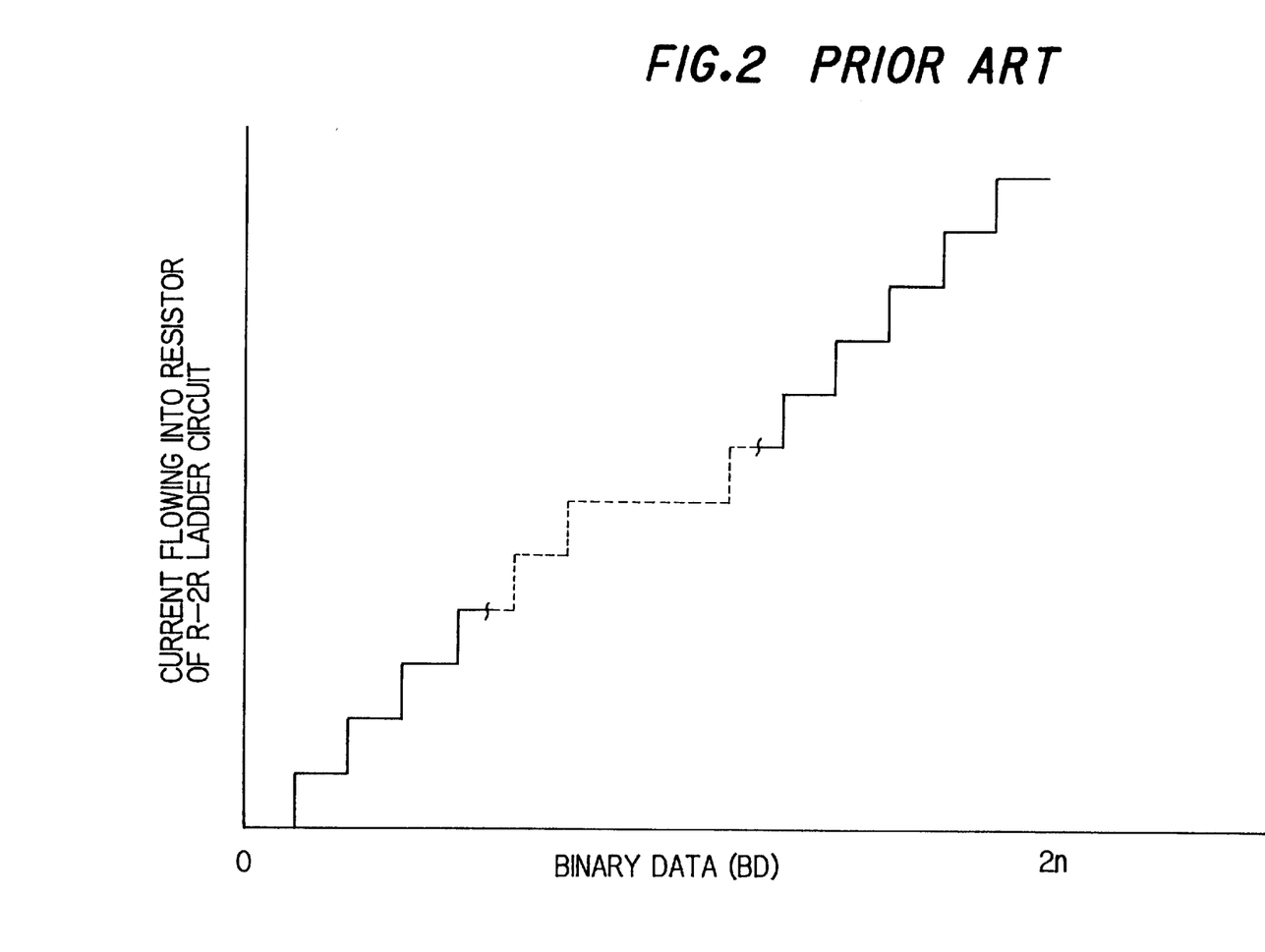
FIG. 2 is a diagram showing the relationship between binary input signal data and the current flowing into the resistors of an R-2R ladder circuit in the circuit shown in FIG. 1.

FIG. 2 shows the relationship between binary data BD and the current flowing into the resistors of the R-2R ladder circuit (in terms of combined resistance value).

For example, when the switch SW1 alone is connected to the negative reference voltage terminal VrefL side with all the remaining SW2–SWn being connected to the positive reference voltage terminal VrefU side, the current I flowing into the resistor of the R-2R ladder circuit is:

$$I=(VrefU-VrefL)/4R$$

In the case of positive reference voltage terminal voltage VrefU=5V, negative reference voltage terminal voltage VrefL=0V, R=10 kΩ, and 2R=20 Ω, the current I is 125 μA, indicating that a current of 125 μA always flows into the R-2R ladder circuit.

Therefore, when the output terminal $V_O$ is in a unused state, the output voltage is once set to VrefU in order to suppress the flow of current into the R-2R ladder circuit. That is, all the switches are set to the VrefU side by means of n binary input signals.

When the output voltage $V_O$ is used again, the binary data BD should be reset.

Figure 3:
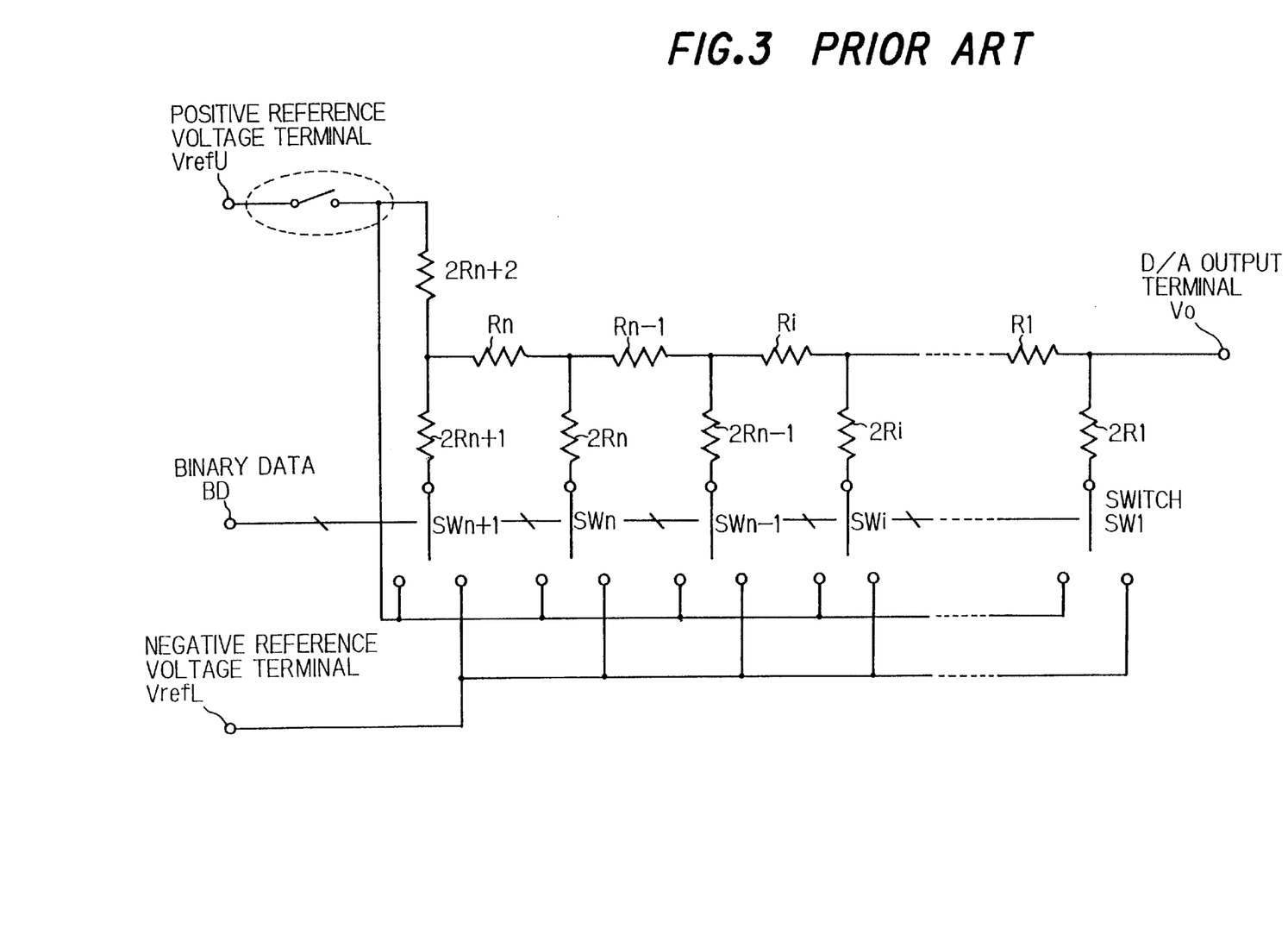
FIG. 3 is a diagram showing the conventional circuit configuration.

FIG. 3 is a diagram showing the configuration of a conventional D/A converter using an R-2R resistor network system wherein the power consumption has been reduced using a switch.

For example, Japanese Patent Laid-Open No. 324139/1993 claims a power-down control system of MCU in a device comprising a plurality of functional sections accommodated in MCU to perform various functions and operations, wherein a register section for stopping the supply of a power into each of the plurality of functional sections including the CPU is provided. In this proposed system, a switch is used to stop the supply of a current into an internal circuit.

When the reference voltage is provided by a voltage divider connected to an external power source, a current flows from the positive reference voltage terminal VrefU into the R-2R ladder circuit. As described above, varying the output voltage value results in varied current flowing into the R-2R ladder circuit, leading to a fear of the reference voltage value being varied.

Figure 4:
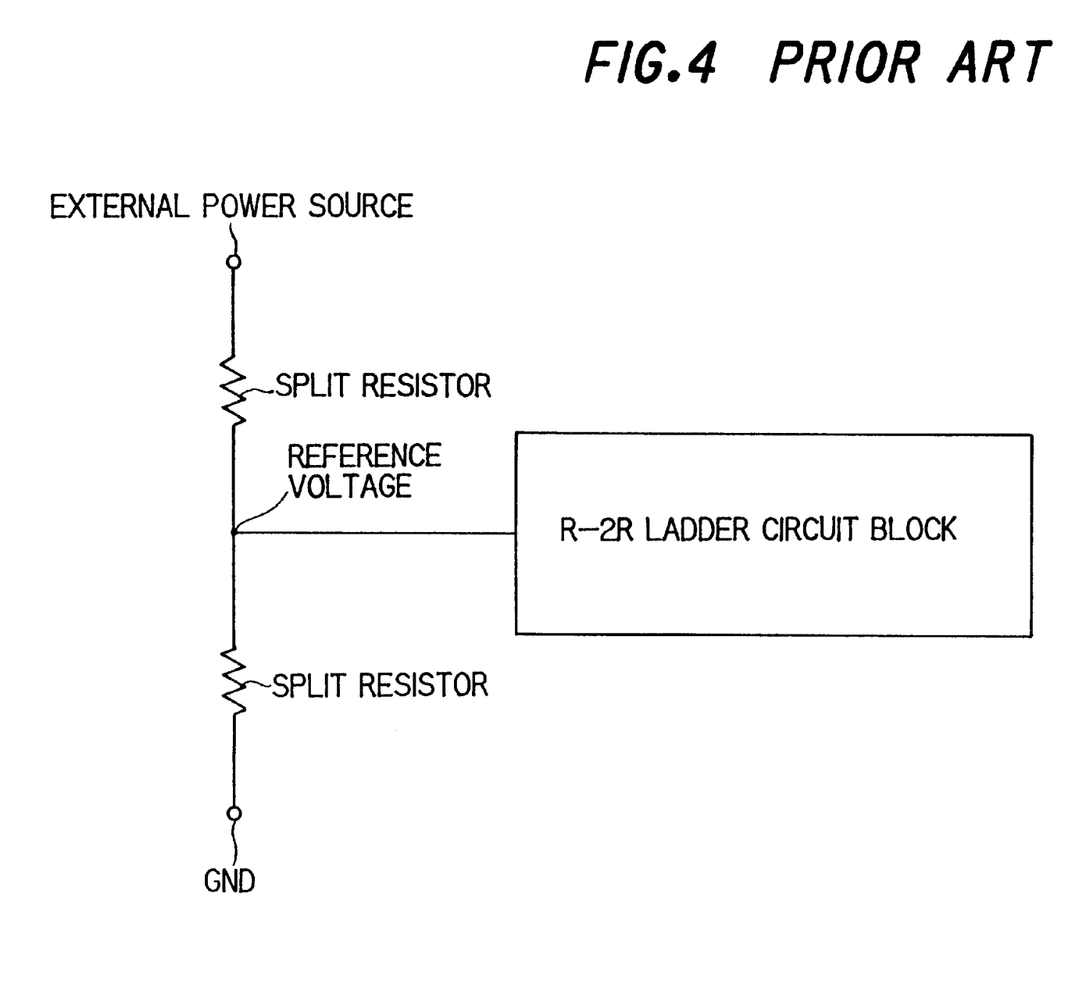
FIG. 4 is a block diagram in the case where the reference voltage is provided by split resistors from an external power source.
Figure 5:
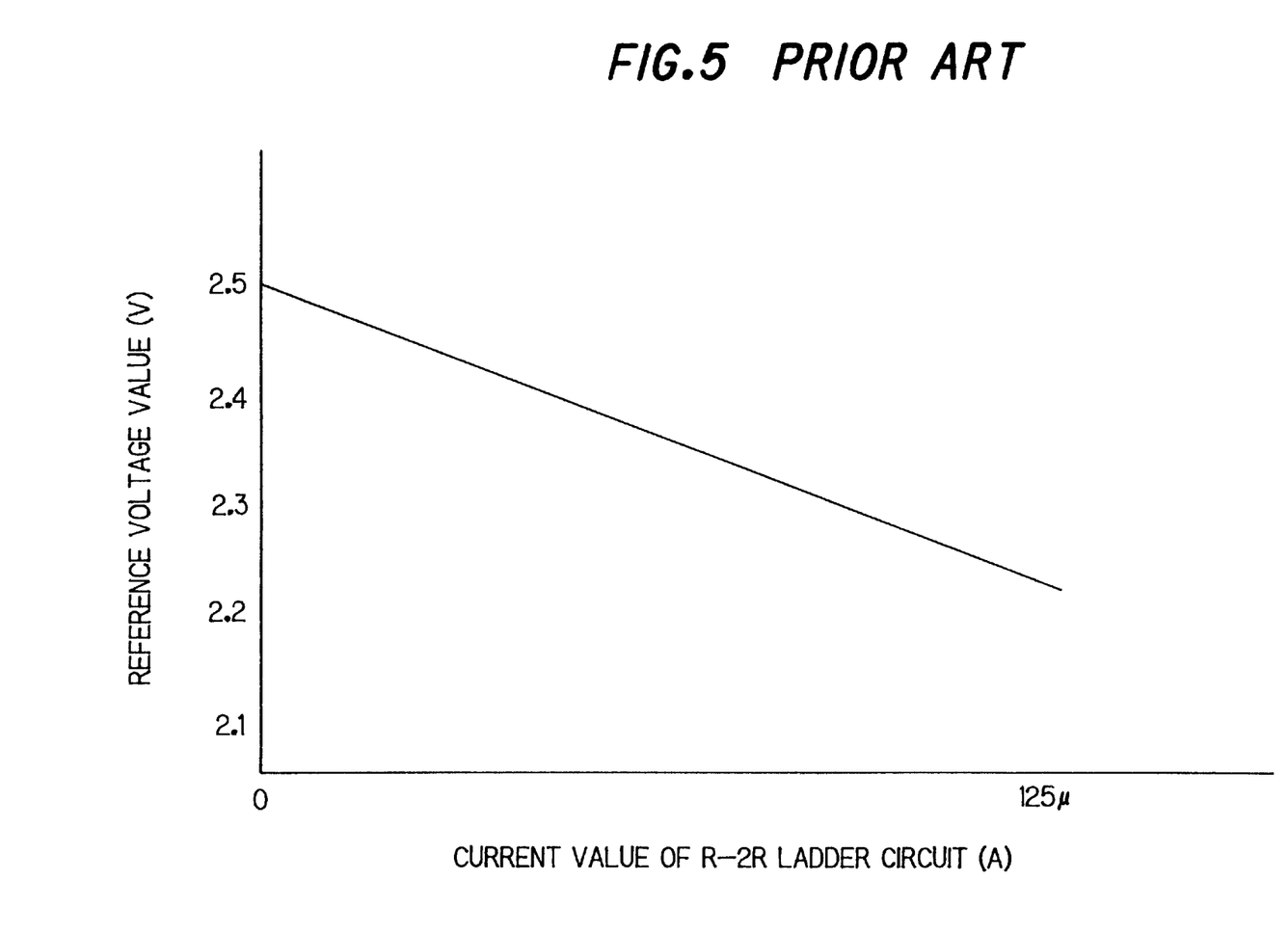
FIG. 5 is a diagram showing the relationship between the current in the R-2R ladder circuit shown in FIG. 3 and the reference voltage.

FIG. 4 is a block diagram in the case where the voltage of the external power source is 5V, the split resistance of the external power source is 10 kΩ, the resistance of the R-2R ladder circuit is 10 kΩ for R and 20 kΩ for 2R. FIG. 5 is a diagram showing the reference voltage value as a function of a change in the current flowing into the R-2R ladder circuit.

This diagram shows that there is a drop in the reference voltage of (2.50–2.22)=0.28V between when no current flows into the R-2R ladder circuit and when the maximum current flows into the R-2R ladder circuit.

Thus, in the circuit configuration shown in FIG. 3, regarding the R-2R ladder circuit of the D/A converter, addition of the switch has solved only the problem of suppressing current consumption during the unused condition of the D/A converter. There is still a variation in impedance of the reference voltage, however, which unfavorably results in a variation in the current fed. This requires provision of an exterior type current supply buffer for use during usual operation.

Next, a D/A converter of a preferred embodiment according to the invention will be explained in FIGS. 6 and 7.

Figure 6:
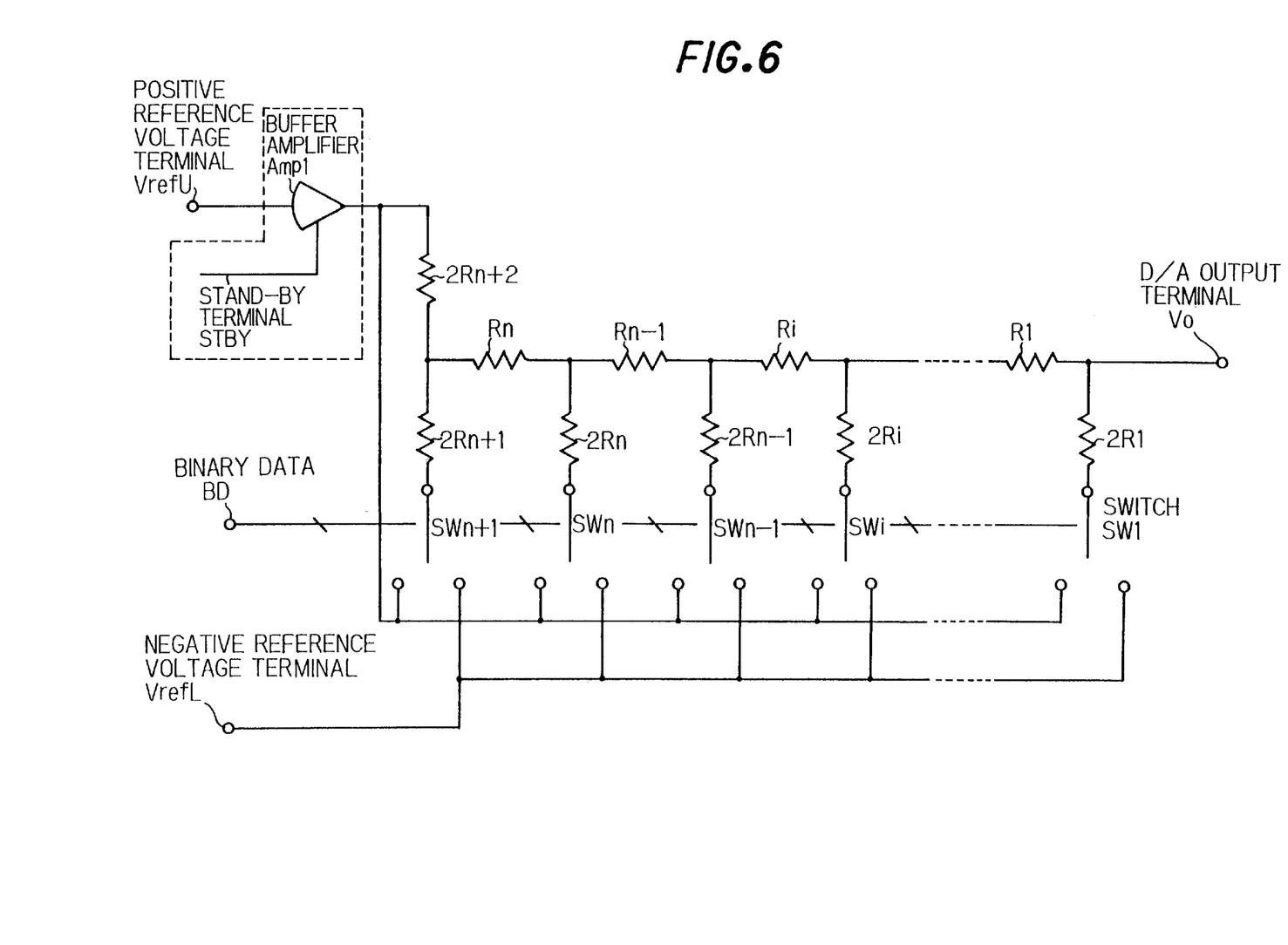
FIG. 6 is a diagram showing the circuit configuration according to one embodiment of the present invention.

With reference to FIG. 6, in the embodiment of the present invention, a buffer amplifier (Ampl) is inserted between the resistance 2Rn+2 and the positive reference voltage terminal VrefU in the conventional D/A converter shown in FIG. 1. The buffer amplifier (Ampl) has a stand-by terminal which can bring the output to a high impedance state.

During the unused condition of the D/A output, the stand-by input signal (STBY) is made active ("H"). This permits the output of the 4 buffer amplifier (Ampl) to be brought to a high impedance state, which in turn can stop the supply of current into the R-2R ladder circuit and suppress the current consumption. At that time, the D/A output terminal (Vo) is in a high impedance state independently of the binary input signal (BD) value.

When the D/A output is used again, the signal input into the stand-by terminal (STBY) is brought to an "L" state to put the buffer amplifier (Ampl) into operation, permitting a current to be supplied to the internal circuit.

Figure 7:
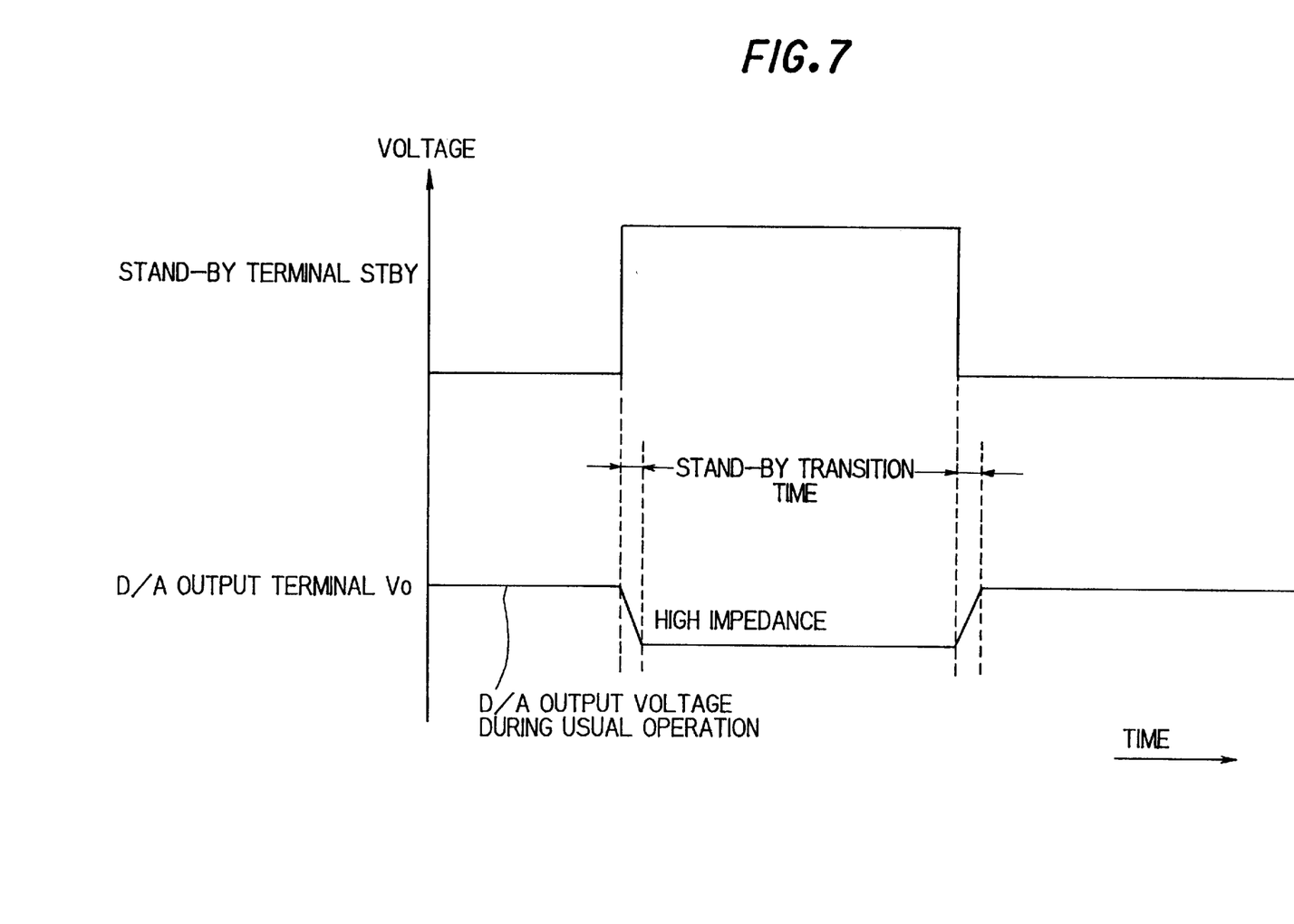
FIG. 7 is a timing chart for stand-by signals and D/A output according to one embodiment of the present invention.

A timing chart for signals (STBY) input into the stand-by terminal and the output waveform of the D/A output terminal (Vo) is shown in FIG. 7.

Incorporation of the buffer amplifier (Ampl), because it has a very small and negligible output impedance and is operable to change its impedance, enables a given current to be supplied into the internal circuit even when the impedance of the positive reference voltage (VrefU) during usual operation is larger than that of the resistance value of the R-2R ladder circuit.

For example, even the reference voltage is provided using a voltage divider from an external power source, the reference voltage can be kept stable independently of the current value of the R-2R ladder circuit.

As described above, the D/A converter according to the present invention, by virtue of incorporation of a buffer amplifier with a stand-by function, which can serve both as a switch for stopping the supply of a current into the internal circuit and as a buffer for supplying a given current into the internal circuit, can reduce the power consumption during the unused condition of the D/A output and, at the same time, enable a stable reference voltage to be fed during usual operation.

The invention has been described in detail with particular reference to a preferred embodiment, but it will be understood that variations and modifications can be effected within the scope of the invention as set forth in the appended claims.

What is claimed is:

1. A D/A converter with an R-2R ladder circuit comprising: n resistors (R); (n+2) resistors (2R) of which the resistance value is twice that of the resistor R; (n+1) switches (SW); a first reference voltage terminal (VrefU); a second reference voltage terminal (VrefL); and (n+1) binary input signal terminals (BD), said D/A converter further comprising a buffer amplifier of which the on-off control can be performed by utilizing a stand-by signal of said D/A converter, and a voltage divider comprising a pair of resistors provided between said first and second reference voltage terminals, and said R-2R ladder circuit being connected to a connecting point of said pair of resistors, wherein said buffer amplifier is provided between said first reference voltage terminal and one end of the voltage divider.

2. (Amended) A D/A converter with an R-2R ladder circuit comprising: n resistors (R); (n+2) resistors (2R) of which the resistance value is twice that of the resistor R; (n+1) switches (SW); a first reference voltage terminal (VrefU); a second reference voltage terminal (VrefL); and (n+1) binary input signal terminals (BD), said D/A converter further comprising a buffer amplifier of which the on-off control can be performed by utilizing a stand-by signal of said D/A converter, and wherein the buffer amplifier, when the stand-by signal to the buffer amplifier is active, brings the output of the R-2R ladder circuit to a high impedance state in a stand-by state of the D/A converter.

3. A D/A converter comprising:

a voltage divider comprising a pair of resistors provided between first and second reference voltage terminals;

an R-2R ladder circuit being provided at a connecting point of said pair of resistors; and a buffer amplifier provided between said first reference voltage terminal and one end of the voltage divider;

wherein the buffer amplifier, when the stand-by signal is active, brings the output to a high impedance state in a stand-by state of the D/A converter.

4. A D/A converter comprising:

first and second reference voltage terminals and a binary data terminal;

a buffer amplifier having an input terminal connected to said first reference voltage terminal, a control terminal, and an output terminal;

a voltage divider comprising a pair of resistors, one end of said voltage divider being connected to said buffer amplifier output terminal and the other end being connected to a switch, said switch being operable for connecting said voltage divider to either said first or said second reference voltage terminal in response to binary data applied to said binary data terminal;

an R-2R ladder circuit connected at one end of said ladder circuit to a junction between said pair of resistors of said voltage divider, said ladder circuit comprising n resistors of resistance R, n resistors of resistance 2R, n switches for connecting said n resistors of resistance 2R to either said first or said second reference voltage terminal in response to binary data applied to sid binary data terminal, and another opposite end of said ladder circuit being an output terminal of said D/A converter.

5. The D/A converter of claim 4, wherein said two resistors of said voltage divider have resistance 2R.

6. The D/A converter of claim 5, wherein application of a stand-by signal to said buffer amplifier control terminal places said ladder circuit output terminal in a high impedance state.

7. The D/A converter of claim 4, wherein application of a stand-by signal to said buffer amplifier control terminal places said ladder circuit output terminal in a high impedance state.

* * * * *